United States Patent
Ikeda et al.

(10) Patent No.: US 7,667,389 B2
(45) Date of Patent: Feb. 23, 2010

(54) LIGHT EMITTING ELEMENT, LIGHT EMITTING DEVICE, AND ELECTRONIC DEVICE

(75) Inventors: Hisao Ikeda, Kanagawa (JP); Junichiro Sakata, Kanagawa (JP); Yuji Iwaki, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 649 days.

(21) Appl. No.: 11/294,590

(22) Filed: Dec. 5, 2005

(65) Prior Publication Data

US 2006/0119262 A1 Jun. 8, 2006

(30) Foreign Application Priority Data

Dec. 6, 2004 (JP) .............................. 2004-353448

(51) Int. Cl.
H05B 33/00 (2006.01)
(52) U.S. Cl. .................. 313/506; 313/504; 428/917
(58) Field of Classification Search ................ None
See application file for complete search history.

(56) References Cited

U.S. PATENT DOCUMENTS

| | | | | |
|---|---|---|---|---|
| 5,989,737 | A | 11/1999 | Xie et al. ................ | 428/690 |
| 6,423,429 | B2 | 7/2002 | Kido et al. .............. | 428/690 |
| 7,041,390 | B2* | 5/2006 | Seo et al. ................ | 428/690 |
| 7,297,417 | B2 | 11/2007 | Kim et al. | |
| 7,485,377 | B2 | 2/2009 | Kim et al. | |
| 2001/0046611 | A1 | 11/2001 | Kido et al. .............. | 428/690 |
| 2003/0127967 | A1* | 7/2003 | Tsutsui et al. .......... | 313/498 |
| 2003/0189401 | A1 | 10/2003 | Kido et al. ............. | 313/504 |
| 2005/0088083 | A1* | 4/2005 | Seo et al. ............... | 313/504 |
| 2005/0162074 | A1* | 7/2005 | Madathil et al. ....... | 313/504 |
| 2007/0182317 | A1 | 8/2007 | Kido et al. | |
| 2007/0200125 | A1* | 8/2007 | Ikeda et al. ............ | 257/94 |
| 2009/0115329 | A1 | 5/2009 | Kim et al. | |

FOREIGN PATENT DOCUMENTS

| | | |
|---|---|---|
| CN | 1447629 A | 10/2003 |
| CN | 1836470 A | 9/2006 |
| EP | 0 948 063 A2 | 10/1999 |
| EP | 1 351 558 A1 | 10/2003 |

(Continued)

OTHER PUBLICATIONS

Tokito, S. et al, "Metal Oxides as a Hole-Injecting Layer for an Organic Electroluminescent Device," J. Phys. D: Applied Phys., vol. 29, pp. 2750-2753 (1996).

(Continued)

*Primary Examiner*—Ashok Patel
(74) *Attorney, Agent, or Firm*—Cook Alex Ltd.

(57) ABSTRACT

A light-emitting element is demonstrated which has a mixed layer between a pair of electrodes. The mixed layer comprises a first region and a second region each of which comprises both a metal oxide and a compound that exhibits an electron donating property to the metal oxide. The light-emitting element is characterized in that the first region and the second region are provided alternately and repeatedly in a thickness direction of the mixed layer and have a thickness of 0.1 nm to 10 nm, and that a concentration of the metal oxide in the first region is different from that in the second region.

28 Claims, 12 Drawing Sheets

FOREIGN PATENT DOCUMENTS

| | | |
|---|---|---|
| JP | 03-274695 | 12/1991 |
| JP | 04-357694 | 12/1992 |
| JP | 07-312289 | 11/1995 |
| JP | 09-063771 | 3/1997 |
| JP | 10-255985 | 9/1998 |
| JP | 2824411 | 9/1998 |
| JP | 11-251067 | 9/1999 |
| JP | 2000-315580 | 11/2000 |
| JP | 2003-272860 | 9/2003 |
| JP | 2004-349007 | 12/2004 |
| JP | 2005-026121 | 1/2005 |
| WO | WO 2004/105445 A1 | 12/2004 |
| WO | WO 2005/018284 A1 | 2/2005 |
| WO | WO 2005/031798 A2 | 4/2005 |

OTHER PUBLICATIONS

Imes et al, "Multi Photon Emission Organic EL Devices Using Charge-Transfer Complex as Charge Generation Layer," the $63^{rd}$ Autumn Meeting, Sep. 24, 2002, Extended Abstract, 27a-ZL-12, p. 1165, (2002).

Office Action re Chinese application No. CN 200510127268.2, dated Nov. 28, 2008 (with English translation).

Office Action re Chinese application No. CN 200510127268.2, dated Aug. 14, 2009 (with English translation).

* cited by examiner

LIGHT EMITTING ELEMENT, LIGHT EMITTING DEVICE, AND ELECTRONIC DEVICE

BACKGROUND OF THE INVENTION

1. Field of the Invention

The present invention relates to a light-emitting element that emits light by current excitation, and more particularly relates to the structure of a layer thereof. Further, the present invention relates to a light-emitting device and an electronic device using the light-emitting element.

2. Description of the Related Art

A light-emitting element that has a layer including a luminescent material between a pair of electrodes is used for a pixel, a light source, or the like, and is provided in a light-emitting device such as a display device or a lighting device. In this light-emitting device, the reliability of the light-emitting element is closely related to the performance of the light-emitting device. For example, when a short circuit is caused between the electrodes of the light-emitting element, a display image is distorted, or light of insufficient intensity can emitted.

Therefore, the development of a light-emitting element that is less defective and is able to emit light with stability for a long period of time has been developed recently. For example, Patent Document 1 (Japanese Patent Application Laid-Open No. 9-63771) discloses a technique of manufacturing a light-emitting element that operates at a lower driving voltage by using a metal oxide having a higher work function, such as molybdenum oxide, for an anode. In addition, the-light-emitting element has an improved lifetime.

SUMMARY OF THE INVENTION

It is an object of the present invention to provide a light-emitting element that has fewer defects in operation due to crystallization of a layer included in the light-emitting element, and provide a light-emitting device and an electronic device that use the light-emitting element.

One of light-emitting elements according to the present invention has a mixed layer including a metal oxide and a compound that exhibits an electron donating property to the metal oxide. A first region and a second region are provided in this layer. The metal oxide included in the first region has a higher concentration than the metal oxide included in the second region. The first region and the second region are provided alternately and repeatedly. Each of the first region and the second region has a distance of 0.1 nm or more and 10 nm or less, more preferably 1 nm or more and 5 nm or less, in a thickness direction of the mixed layer. It is preferable here that each of the compound that exhibits an electron donating property to the metal oxide and the metal oxide be included so that the molar ratio of the metal oxide to the compound that exhibits an electron donating property to the metal oxide (=metal oxide/compound) is 0.1 or more and 10 or less (the average value in the whole of the mixed layer).

One of light-emitting elements according to the present invention has a mixed layer including a metal oxide, a first compound, and a second compound. The first compound exhibits an electron donating property to the metal oxide. Further, the second compound has a lower LUMO level than the first compound. A first region and a second region are provided in this layer. The metal oxide included in the first region has a higher concentration than the metal oxide included in the second region. The first region and the second region are provided alternately and repeatedly. Each of the first region and the second region has a distance of 0.1 nm or more and 10 nm or less, more preferably 1 nm or more and 5 nm or less, in a thickness direction of the mixed layer. It is preferable here that each of the first compound and the metal oxide be included so that the molar ratio of the metal oxide to the first compound (=metal oxide/first compound) is 0.1 or more and 10 or less (the average value in the whole of the mixed layer).

One of light-emitting elements according to the present invention has a composite layer including a metal atom, an oxygen atom, and a compound that exhibits an electron donating property to the metal atom, where the metal atom is bound to the oxygen atom. A first region and a second region are provided in this composite layer. The first region and the second regions are provided alternately and repeatedly, and the metal oxide included in the first region has a higher concentration than the metal oxide included in the second region. Each of the first region and the second region has a distance of 0.1 nm or more and 10 nm or less, more preferably 1 nm or more and 5 nm or less, in a thickness direction of the composite layer. It is preferable here that each of the compound that exhibits an electron donating property to the metal atom and the metal atom be included so that the molar ratio of the metal atom to the compound that exhibits an electron donating property to the metal atom (=metal atom/compound) is 0.1 or more and 10 or less (the average value in the whole of the composite layer).

One of light-emitting elements according to the present invention has a composite layer including a metal atom, an oxygen atom, a first compound, and a second compound. The metal atom is bound to the oxygen atom in the composite layer, and the first compound exhibits an electron donating property to the metal atom. Further, the second compound has a lower LUMO level than the first compound. A first region and a second region are provided in this composite layer, and the metal atom included in the first region has a higher concentration than the metal atom included in the second region. The first region and the second regions are provided alternately and repeatedly. Each of the first region and the second region has a distance of 0.1 nm or more and 10 nm or less, more preferably 1 nm or more and 5 nm or less, in a thickness direction of the composite layer. It is preferable here that each of the first compound and the metal atom be included so that the molar ratio of the metal atom to the first compound (=metal atom/first compound) is 0.1 or more and 10 or less (the average value in the whole of the composite layer).

A light-emitting element that has fewer defects in operation due to crystallization of a layer included in the light-emitting element can be obtained by practicing the present invention. Further, a light-emitting element that has a longer life can be obtained by practicing the present invention.

Since the light-emitting element according to the present invention has fewer defects in operation due to crystallization of a layer included in the light-emitting element, a light-emitting device that has fewer defects of images due to defects of the light-emitting element can be obtained by practicing the present invention.

The light-emitting device according to the present invention uses the light-emitting element that has fewer defects in operation due to crystallization of a layer included in the light-emitting element, and thus has fewer defects of images. Accordingly, an electronic device that has fewer image recognition errors due to defects of images displayed in the display device and is capable of transmitting accurate information to users through display images can be obtained by practicing the present invention.

DETAILED DESCRIPTION OF THE INVENTION

Embodiments of the present invention will be described below. However, the present invention may be embodied in a lot of different forms, and it is to be easily understood that various changes and modifications will be apparent to those skilled in the art unless such changes and modifications depart from the scope of the present invention. Therefore, the present invention is not to be construed with limitation to what is described in the embodiments.

Embodiment 1

One embodiment of a light-emitting element according to the present invention will be described with reference to FIGS. 1A and 1B.

Figure 1A:
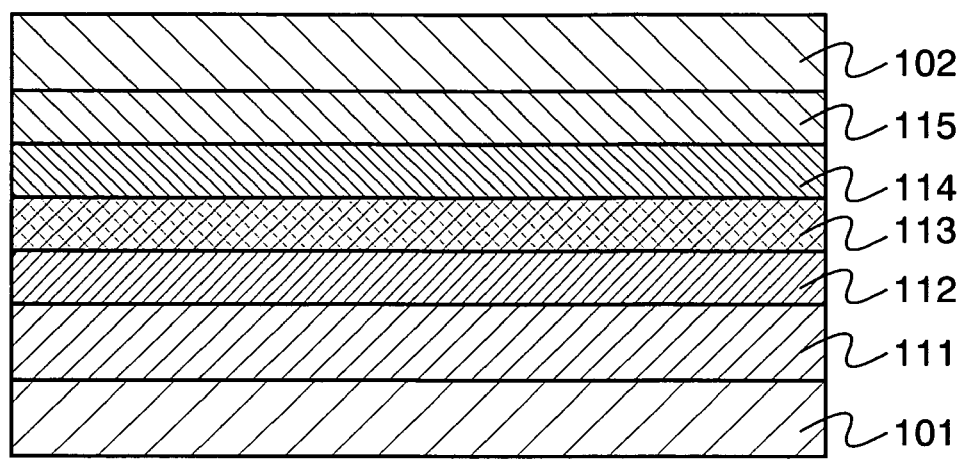
FIGS. 1A and 1B are diagrams illustrating one embodiment of a light-emitting element according to the present invention.

FIG. 1A shows a light-emitting element that has a layer including a luminescent material between a first electrode 101 and a second electrode 102. In the present embodiment, the layer including the luminescent material is formed by stacking a plurality of layers, such as a hole generating layer 111, a hole transporting layer 112, an electron transporting layer 114, and an electron injecting layer 115, in addition to a light-emitting layer 113. The luminescent material is included in the light-emitting layer 113. When a voltage is applied between the first electrode 101 and the second electrode 102 so that the potential of the first electrode 101 is higher than the potential of the second electrode 102, a hole and an electron are injected from the first electrode 101 and the second electrode 102, respectively, into the light-emitting layer 113. The hole and the electron injected into the light-emitting layer 113 are then recombined. The luminescent material included in the light-emitting layer 113 is excited by the recombination. The excited luminescent material produces luminescence in relaxing to the ground state.

Figure 1B:
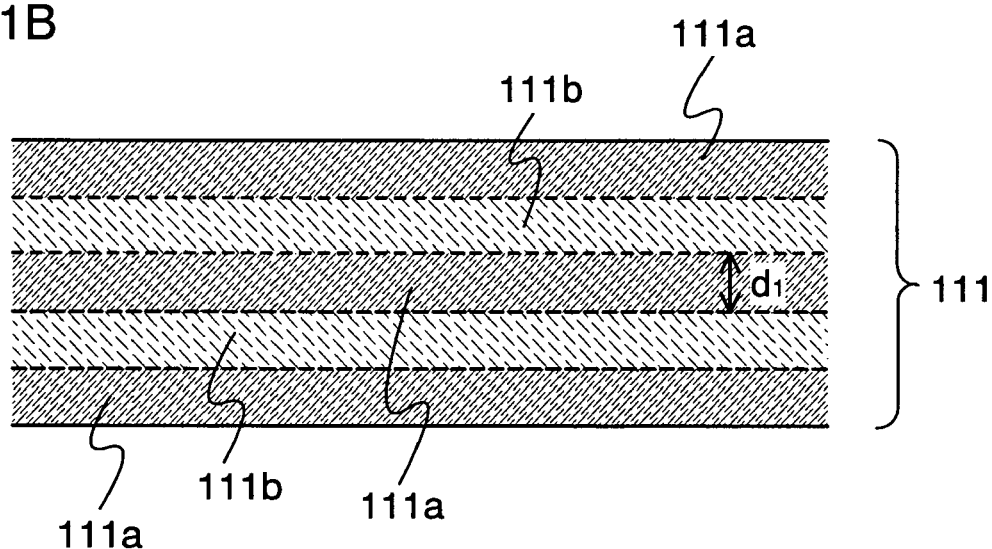

The hole generating layer 111 has a first region 111a and a second region 111b (FIG. 1B). The number of metal atoms included in the first region 111a is larger than the number of atoms included in the second region 111b. Further, the first region 111a and the second region 111b are provided alternately and repeatedly. It is preferable that each of the first region 111a and the second region 111b has a distance of 0.1 nm or more and 10 nm or less, more preferably 1 nm or more and 5 nm or less, in the thickness direction thereof (that is, the distance $d_1$ between one of second regions 111b adjacent to a first region 111a and the other be 0.1 nm or more and 10 nm or less, more preferably 1 nm or more and 5 nm or less). In other words, the region in which the concentration of the metal atom is higher (the first region 111a) is provided at a distance of 0.1 nm or more and 10 nm or less (more preferably 1 nm or more and 5 nm or less) in a cycle in the hole generating layer 111. In the hole generating layer 111, in which metal atoms are distributed as described above, each metal atom is bound to an oxygen atom. It is to be noted that the number of repetitions of the first region 111a and the second region 111b is not particularly limited.

It is preferable that the metal atoms here be metal atoms belonging to any of Groups 4 to 8 of the periodic table of the elements, such as vanadium, molybdenum, rhenium, and ruthenium. The metal elements belonging to any of Groups 4 to 8 of the periodic table of the elements further include titanium, zirconium, hafnium, tantalum, chromium, tungsten, manganese, and osmium.

In the hole generating layer 111, a first compound is included. The first compound exhibits an electron donating property to a compound including a structure in which a metal atom is bound to a oxygen atom (as this compound, oxides of metals belonging to any of Groups 4 to 8 of the periodic table of the elements, for example, molybdenum oxide, vanadium oxide, rhenium oxide, and ruthenium oxide can be cited). It is to be noted that an electron transfer complex can be produced by exhibiting the electron donating property.

Examples of the first compound that can be used for practicing of the present invention include aromatic amine compounds including a structure of triphenylamine. Specific examples of the aromatic amine compounds include 4'-bis[N-(1-naphthyl)-N-phenylamino]biphenyl (abbreviation: NPB), 4,4'-bis[N-(3-methylphenyl)-N-phenylamino]-biphenyl (abbreviation: TPD), 4,4', 4''-tris (N,N-diphenylamino)-triphenylamine (abbreviation: TDATA), 4,4', 4''-tris[N-(3-methylphenyl)-N-phenylamino]-triphenylamine (abbreviation: MTDATA), 4,4'-bis{N-[4-(N,N-di-m-tolylamino) phenyl]-N-phenylamino}biphenyl (abbreviation: DNTPD), 1,3,5-tris [N,N-di (m-tolyl) amino]benzene (abbreviation: m-MTDAB), and 4,4', 4''-tris (N-carbazolyl) triphenylamine (abbreviation: TCTA). These are materials in which the hole mobility is higher than the electron mobility and the ratio of the hole mobility to the electron mobility (=hole mobility/electron mobility) is more than 100, so-called monopolar materials, and are particularly highly hole transporting materials of monopolar materials. In addition to the monopolar materials mentioned here, bipolar materials such as 2,3-bis (4-diphenylaminophenyl) quinoxaline (abbreviation: TPAQn) may be used. The bipolar materials here indicate materials in which the ratio of the mobility of one carrier to the mobility of the other is 100 or less, preferably 10 or less when the mobility of either carrier, an electron or a hole, is compared to the mobility of the other carrier.

In addition, it is preferable that a second compound be further included in the hole generating layer 111. The second compound is preferably a compound that has a lowest unoccupied molecular orbital (LUMO) level lower than that of the first compound. By further including the second compound as described above, the first compound can be prevented from being deteriorated due to generated carriers, and the life of the light-emitting element can be thus prolonged. Specific examples of the second compound include rubrene, copper phthalocyanine, 4-dicyanomethylene-2-isopropyl-6-[2-(1,1,7,7-tetramethyljulolidine-9-yl) ethenyl]-4H-pyran (abbreviation: DCJTI), 4-dicyanomethylene-2-tert-butyl-6-[2-(1,1,7,7-tetramethyljulolidine-9-yl) ethenyl]-4H-pyran (abbreviation: DCJTB), N,N'-dimethylquinacridone (abbreviation: DMQd), N,N'-diphenylquinacridone (abbreviation: DPQd), and coumarin 6.

Further, it is preferable that the first compound and the metal atoms are included in the hole generating layer 111 so that the molar ratio of the metal atom to the first compound (=metal atom/first compound) is 0.1 or more and 10 or less, more preferably 0.5 or more and 5 or less. Further, it is preferable that molar ratio of second compound to the first compound (=second compound/first compound) is 0.005 or more and 0.1 or less, more preferably 0.01 or more and 0.08 or less, in the hole generating layer 111 (the molar ratios mentioned here are the average values in the whole of the hole generating layer).

The hole generating layer 111, which has the structure described above, is able to generate holes. Accordingly, even when it is hard to inject holes from the first electrode 101, holes can be transported stably into the light-emitting layer 113 by providing the hole generating layer 111. Further, the hole generating layer 111, which has the structure described above, is not easily crystallized, and has favorable stability.

The light-emitting layer 113 includes the luminescent material. The luminescent material here is a material that provides a favorable luminous efficiency and is capable of producing luminescence of a desired wavelength. The light-emitting layer 113 may be a layer formed by using a luminescent material. However, in the case of causing concentration quenching, it is preferable that the light-emitting layer 113 may be formed by dispersing luminescent materials in a layer composed of a material that has a larger energy gap than the luminescent materials. Quenching of luminescence due to the concentration can be prevented by including a luminescent material dispersed in the light-emitting layer 113. The energy gap here indicates the energy gap between a LUMO level and a HOMO level.

The luminescent material is not particularly limited, for which a material that provides a favorable luminous efficiency and is capable of producing luminescence of a desired wavelength may be used. For example, when red or reddish luminescence is desired to be obtained, a material that produces luminescence with an emission spectrum peak from 600 nm to 680 nm, such as 4-dicyanomethylene-2-isopropyl-6-[2-(1,1,7,7-tetramethyljulolidine-9-yl) ethenyl]-4H-pyran (abbreviation: DCJTI), 4-dicyanomethylene-2-methyl-6-[2-(1,1,7,7-tetramethyljulolidine-9-yl) ethenyl]-4H-pyran (abbreviation: DCJT), 4-dicyanomethylene-2-tert-butyl-6-[2-(1,1,7,7-tetramethyljulolidine-9-yl) ethenyl]-4H-pyran (abbreviation: DCJTB), periflanthene, and 2,5-dicyano-1,4-bis-[2-(10-methoxy-1,1,7,7-tetramethyljulolidine-9-yl) ethenyl]-benzene, can be used as the luminescent material. When green or greenish luminescence is desired to be obtained, a material that produces luminescence with an emission spectrum peak from 500 nm to 550 nm, such as N,N'-dimethylquinacridone (abbreviation: DMQd), coumarin 6, coumarin 545T, and tris (8-quinolinolato) aluminum (abbreviation: $Alq_3$), can be used. When blue or bluish luminescence is desired to be obtained, a material that produces luminescence with an emission spectrum peak from 420 nm to 500 nm, such as 9,10-bis (2-naphthyl)-2-tert-butylanthracene (abbreviation: t-BuDNA), 9,9'-bianthryl, 9,10-diphenylanthracene (abbreviation: DPA), 9,10-di (2-naphthyl) anthracene (abbreviation: DNA), bis (2-methyl-8-quinolinolato)-4-phenylphenolato-gallium (abbreviation: BGaq), and bis (2-methyl-8-quinolinolato)-4-phenylphenolato-aluminum (abbreviation: BAlq), can be used as the luminescent material. In addition to materials that produce fluorescence as mentioned above, materials that produce phosphorescence, such as bis[2-(3',5'-bis (trifluoromethyl) phenyl) pyridinato-N, $C^{2'}$]iridium (III) picolinate ($Ir(CF_3ppy)_2(pic)$), bis[2-(4',6'-difluorophenyl) pyridinato-N, $C^{2'}$] ridium (III) acetylacetonate (FIr(acac)), bis[2-(4',6'-difluorophenyl) pyridinato-N, $C^{2'}$]ridium (III) picolinate (FIr(pic)), and tris (2-phenylpyridinato-N, $C^{2'}$) iridium (abbreviation: $Ir(ppy)_3$) can also be used as the luminescent material.

In addition, the material that is included in the light-emitting layer 113 together with the luminescent material and is used for making the luminescent material dispersed is not particularly limited, and may be appropriately selected in consideration of the energy gap of the material that is used as the luminescent material and the like. For example, anthracene derivatives such as 9,10-di (2-naphthyl)-2-tert-butylanthracene (abbreviation: t-BuDNA), carbazole derivatives such as 4,4'-bis (N-carbazolyl)-biphenyl (abbreviation: CBP), quinoxaline derivatives such as 2,3-bis (4-diphenylaminophenyl) quinoxaline (abbreviation: TPAQn) and 2,3-bis{4-[N-(1-naphthyl)-N-phenylamino]phenyl}-dibenzo[f, h]quinoxaline (abbreviation: NPADiBzQn), and metal complexes such as bis[2-(2-hydroxyphenyl)-pyridinato]zinc (abbreviation: $Znpp_2$) and bis[2-(2-hydroxyphenyl)-benzoxazolato]zinc (abbreviation: ZnBOX) can be used together with the luminescent material.

It is preferable to provide the hole transporting layer 112 between the light-emitting layer 113 and the hole generating layer 111 as shown in FIG. 1. The hole transporting layer 112 is a layer that has a function of transporting holes, which has a function of transporting holes injected from the first electrode 101 side to the light-emitting layer 113. By providing the hole transporting layer 112 in this way, the hole generating layer 111 can be kept further away from the light-emitting element 113 so that quenching of luminescence due to the metal included in the hole generating layer 111 can be prevented. It is preferable to form the hole transporting layer 112 with the use of a highly hole transporting material, in particular, with the use of a material that has a hole mobility of $1 \times 10^{-6}$ $cm^2/Vs$ or more. As the highly hole transporting material, for example, NPB, TPD, TDATA, MTDATA, DNTPD, m-MTDAB, and TCTA can be cited. However, another material other than these may be used.

It is preferable to provide the electron transporting layer 114 between the light-emitting layer 113 and the second electrode 102 as shown in FIG. 1. The electron transporting layer 114 is a layer that has a function of transporting electrons, which has a function of transporting electrons injected from the second electrode 102 side to the light-emitting layer 113. By providing the electron transporting layer 114, the second electrode 102 can be kept further away from the light-emitting element 113 so that quenching of luminescence due to the metal included in the second electrode 102 can be prevented. In addition, also when a metal is included in the electron injecting layer 115, quenching due to the metal can be prevented in the same way by providing the electron transporting layer 112 to keep the electron injecting layer 115 further away from the light-emitting layer 113. It is preferable to form the electron transporting layer 114 with the use of a highly electron transporting material, in particular, with the use of a material that has an electron mobility of $1\times10^{-6}$ cm$^2$/Vs or more. It is to be noted that the highly electron transporting material indicates a material in which the hole mobility is higher than the electron mobility and the ratio of the electron mobility to the hole mobility (=electron mobility/hole mobility) is more than 100. Specific examples of materials that can be used for forming the electron transporting layer 114 include metal complexes such as tris (8-quinolinolato) aluminum (abbreviation: Alq$_3$), tris (4-methyl-8-quinolinolato) aluminum (abbreviation: Almq$_3$), bis (10-hydroxybenzo[h]quinolinato) beryllium (abbreviation: BeBq$_2$), bis (2-methyl-8-quinolinolato)-4-phenylphenolato-aluminum (abbreviation: BAlq), bis[2-(2-hydroxyphenyl)-benzoxazolato]zinc (abbreviation: Zn(BOX)$_2$), and bis[2-(2-hydroxyphenyl)-benzothiazolato]zinc (abbreviation: Zn(BTZ)$_2$), and 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), and 4,4-bis (5-methylbenzoxazol-2-yl) stilbene (abbreviation: BzOs).

It is to be noted that each of the hole transporting layer 112 and the electron transporting layer 114 may be formed with the use of a bipolar material, for example, TPAQn, besides a monopolar material as mentioned above. It is preferable to use a bipolar material that has hole and the electron mobilities of $1\times10^{-6}$ cm$^2$/Vs or more among other bipolar materials. Further, the hole transporting layer 112 and the electron transporting layer 114 may be formed with the use of the same bipolar material.

Furthermore, the electron injecting layer 115 may be provided between the electron transporting layer 114 and the second electrode 102. The electron injecting layer 115 is a layer that has a function of assisting injection of electrons from the second electrode 102 to the electron transporting layer 114. By providing the electron injecting layer 115, the difference in electron affinity between the second electrode 102 and the electron transporting layer 114 is reduced, and electrons are thus easily injected. It is preferable to form the electron injecting layer 115 with the use of a material that has an electron affinity larger than that of the material forming the electron transporting layer 114 and smaller than that of the material forming the second electrode 102, or a material that has an energy band bent when the material is provided between the electron transporting layer 114 and the second electrode 102 as a thin film of 1 to 2 nm. Examples of materials that can be used for forming the electron injecting layer 115 include inorganic substances such as alkali metals, alkali-earth metals, fluorides of alkali metals, fluorides of alkali-earth metals, oxides of alkali metals, and oxides of alkali-earth metals, and more specifically, include lithium oxide, magnesium oxide, lithium fluoride, and calcium fluoride. In addition, besides inorganic substances, the materials that can be used for forming the electron transporting layer 114, such as BPhen, BCP, BCP, p-EtTAZ, and BzOs, can also be used as the material forming the electron injecting layer 115, provided that a material that has a larger electron affinity than a material that is used for forming the electron transporting layer 114 is selected from these materials, namely, the electron injecting layer 115 can be formed by selecting a material so that the electron affinity in the electron injecting layer 115 is larger than the electron affinity in the electron transporting layer 114.

Alternatively, instead of the electron injecting layer 115, an electron generating layer may be provided. The electron generating layer can be formed by mixing an electron donating material, such as an alkali metal, alkali-earth metal, a fluoride of an alkali metal, a fluoride of an alkali-earth metal, an oxide of an alkali metal, and an oxide of an alkali-earth metal, with a highly electron accepting material.

The first electrode 101 may be formed with the use of a material that has a larger work function, such as gold (Au), platinum (Pt), nickel (Ni), tungsten (W), chromium (Cr), molybdenum (Mo), iron (Fe), cobalt (Co), copper (Cu), palladium (Pd), and tantalum nitride, or with the use of a material that has a smaller work function, such as aluminum and magnesium. In this way, in the light-emitting element of this embodiment, the first electrode 101 can be formed regardless of the work function of material. This is because the hole generating layer 111 is provided between the first electrode 101 and the light-emitting layer 113.

In addition, it is preferable that the second electrode 102 be formed with the use of a material that has a lower work function, for example, aluminum, magnesium, or an alloy of silver and magnesium. However, in the case of providing an electron generating layer instead of the electron injecting layer, the work function is not particularly restricted. For example, a material that has a higher work function, such as indium tin oxide, indium tin oxide containing silicon oxide, indium oxide containing zinc oxide, and further, gold (Au), platinum (Pt), nickel (Ni), tungsten (W), chromium (Cr), molybdenum (Mo), iron (Fe), cobalt (Co), copper (Cu), palladium (Pd), and tantalum nitride, may be used for forming the second electrode 102.

Figure 2:
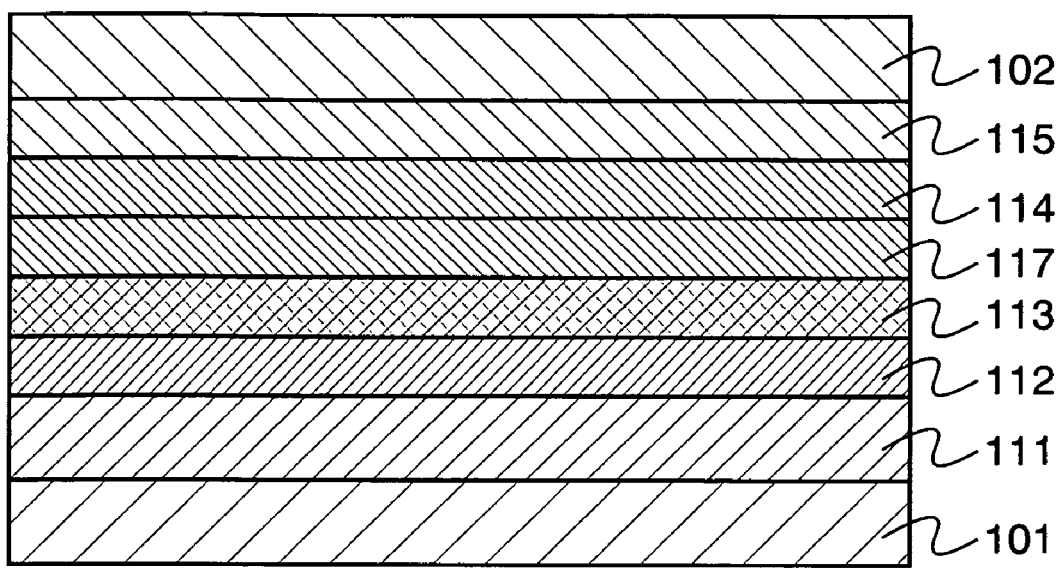
FIG. 2 is a diagram illustrating one embodiment of a light-emitting element according to the present invention.

Further, as shown in FIG. 2, a hole blocking layer 117 may be provided between the light-emitting layer 113 and the electron transporting layer 114. By providing the hole blocking layer 117, holes can be prevented from going through the light-emitting layer 113 and flowing toward the second electrode 102, and the carrier recombination efficiency can be thus enhanced. Further, excitation energy generated in the light-emitting layer 113 can be prevented from transferring to the other layers such as the electron transporting layer 114. The hole blocking layer 117 can be formed by selecting a material that has a larger ionization potential than a material that is used for forming the light-emitting layer 113 from among other materials that can be used for forming the electron transporting layer 114, such as BAlq, OXD-7, TAZ, and BPhen. Similarly, a layer for preventing electrons from going through the light-emitting layer 113 and flowing toward the first electrode 101 may be provided also between the light-emitting layer 113 and the hole transporting layer 112.

It is to be noted that the practitioner may choose whether or not to the hole transporting layer 112, the electron transporting layer 114, and the electron injecting layer 115. For example, when a problem such as quenching due to a metal is not caused without providing the hole transporting layer 112 or the electron transporting layer 114, it is not always necessary to provide these layers.

The driving voltage of the thus described light-emitting element according to the present invention changes little depending on the thickness of the hole generating layer 111. Therefore, the distance between the light-emitting layer 113 and the first electrode 101 can be easily adjusted by changing the thickness if the hole generating layer 111, namely, it is easy to adjust the length of a light path through which emitted light passes (light path length). Further, the surface of the first electrode 101 is made to have more flatness by making the thickness of the hole generating layer 111 thicker, and a short-circuit between the electrodes can be thus prevented easily.

Embodiment 2

A light-emitting element according to the present invention has the ability to reduce defects in operation due to crystallization of compounds included in a layer included in the light-emitting element, further has the ability to prevent a short circuit between electrodes when the thickness of a hole generating layer is made thicker, and further has the ability to improve the external extraction efficiency of luminescence and/or provide luminescence with favorable color purity when the light path length is adjusted by changing the thickness of the hole generating layer. Therefore, a favorable light-emitting device that has fewer defects of images due to defects in operation of the light-emitting element can be obtained by using the light-emitting element according to the present invention for a pixel. Further, a light-emitting device that is capable of providing images with favorable display colors can be obtained by using the light-emitting element according to the present invention for a pixel. Further, a light-emitting device that has less trouble due to defects in operation of the light-emitting element and is capable of emitting light well can be obtained by using the light-emitting element according to the present invention for a light source.

In the present embodiment, the circuit configuration and driving method of a light-emitting device that has a display function will be described with reference to FIGS. 3 to 6.

Figure 3:
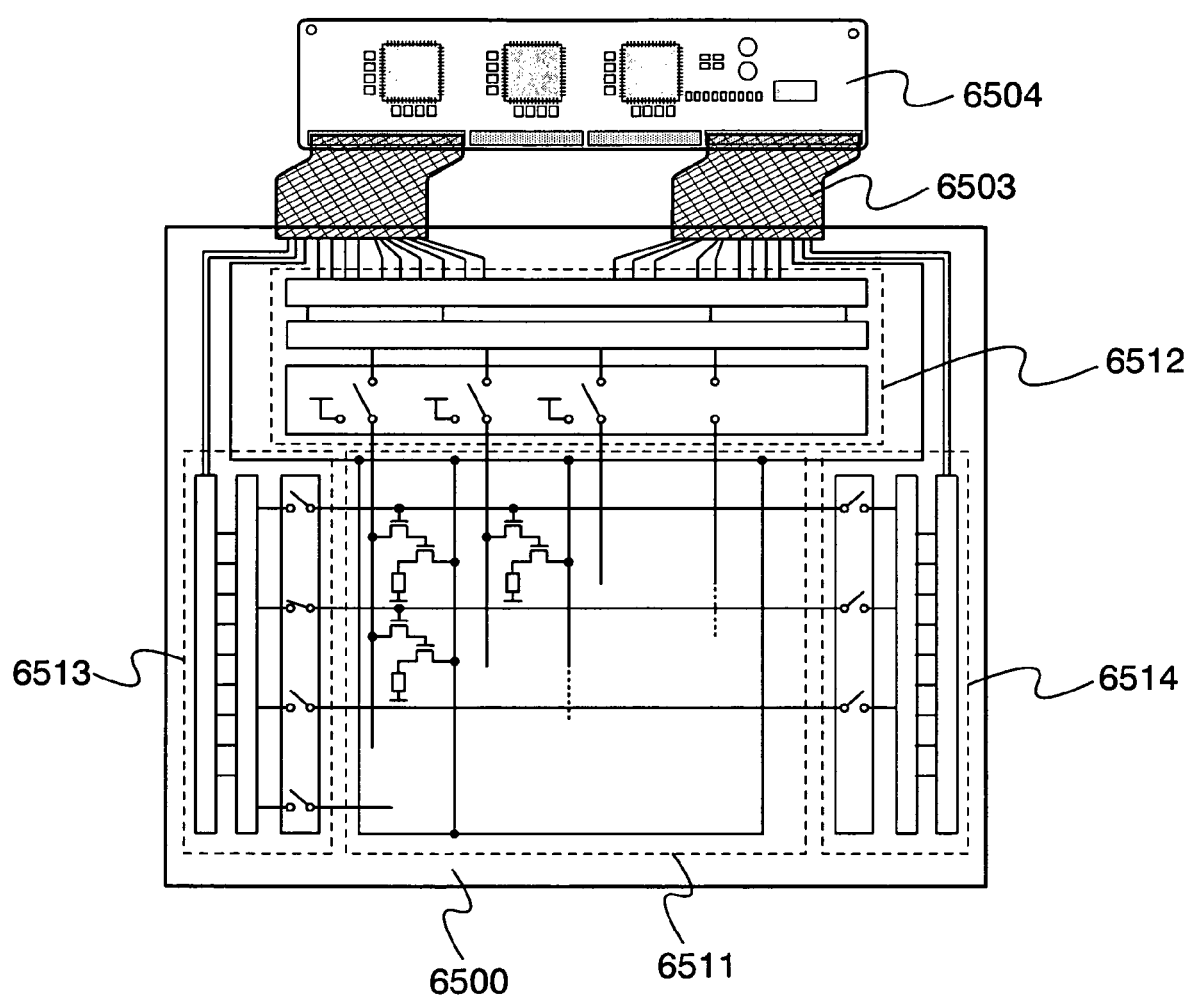
FIG. 3 is a diagram illustrating one embodiment of a light-emitting device according to the present invention.

FIG. 3 is an overhead schematic view of a light-emitting device to which the present invention is applied. In FIG. 3, a pixel portion 6511, a source signal line driver circuit 6512, a gate signal line driver circuit 6513 for writing, and a gate signal line driver circuit 6514 for erasing are provided over a substrate 6500. Each of the source signal line driver circuit 6512, the gate signal line driver circuit 6513 for writing, and the gate signal line driver circuit 6514 for erasing is connected to FPC (Flexible Printed Circuit) 6503 that is an external input terminal through a group of wirings. Further, each of the source signal line driver circuit 6512, the gate signal line driver circuit 6513 for writing, and the gate signal line driver circuit 6514 for erasing receives signals such as a clock signal, a start signal, and a reset signal from the FPC 6503. In addition, a printed wiring board (PWB) 6504 is attached to the FPC 6503. It is to be noted that it is not always necessary to provide each driver circuit portion on the same substrate on which the pixel portion 6511 is provided as described above. For example, the driver circuit portion may be provided outside the substrate by using a TCP that has an IC chip on an FPC on which a wiring pattern is formed.

In the pixel portion 6511, a plurality of source signal lines extending in columns is arranged in rows, current supply lines are arranged in rows, and a plurality of gate signal lines extending in rows is arranged in columns. Further, in the pixel portion 6511, a plurality of circuits each including a light-emitting element is arranged.

Figure 4:
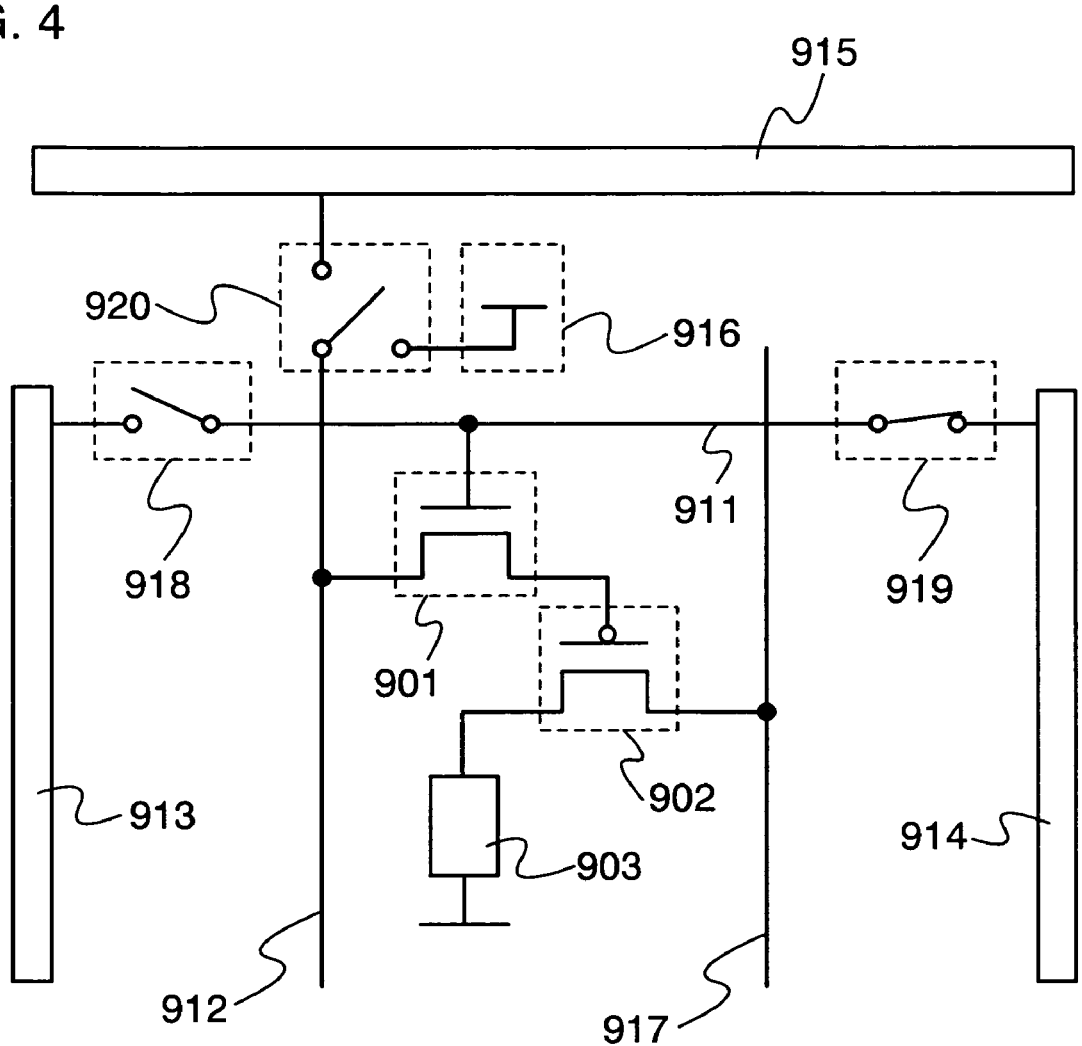
FIG. 4 is a diagram illustrating one embodiment of a circuit for driving a pixel provided in a light-emitting device according to the present invention.

FIG. 4 is a diagram showing a circuit for operating one pixel. The circuit shown in FIG. 4 includes a first transistor 901, a second transistor 902, and a light-emitting element 903.

Each of the first transistor 901 and the second transistor 902 is a three-terminal element including a gate electrode, a drain region, and a source region, and including a channel region between the drain region and the source region. Here, since a source region and a drain region are switched with each other in accordance with a structure or operating conditions of a transistor, it is difficult to identify which one is the drain region or the source region. Consequently, regions that serve as a source or a drain are referred to as first and second electrodes of a transistor in the present embodiment.

A gate signal line 911 and a gate signal line driver circuit 913 for writing are provided so as to be electrically connected or unconnected by a switch 918, the gate signal line 911 and a gate signal line driver circuit 914 for erasing are provided so as to be electrically connected or unconnected by a switch 919, and a source signal line 912 is provided so as to be electrically connected to any one of a source signal line driver circuit 915 and a power source 916 by a switch 920. Further, the first transistor 901 has a gate electrically connected to the gate signal line 911, a first electrode electrically connected to the source signal line 912, and a second electrode electrically connected to a gate electrode of the second transistor 902. The second transistor 902 has a first electrode electrically connected to a current supply line 917 and a second electrode electrically connected to one electrode included in the light-emitting element 903. It is to be noted that the switch 918 may be included in the gate signal line driver circuit 913 for writing, the switch 919 may be included in the gate signal line driver circuit 914 for erasing, and the switch 920 may be included in the source signal line driver circuit 915.

Figure 5:
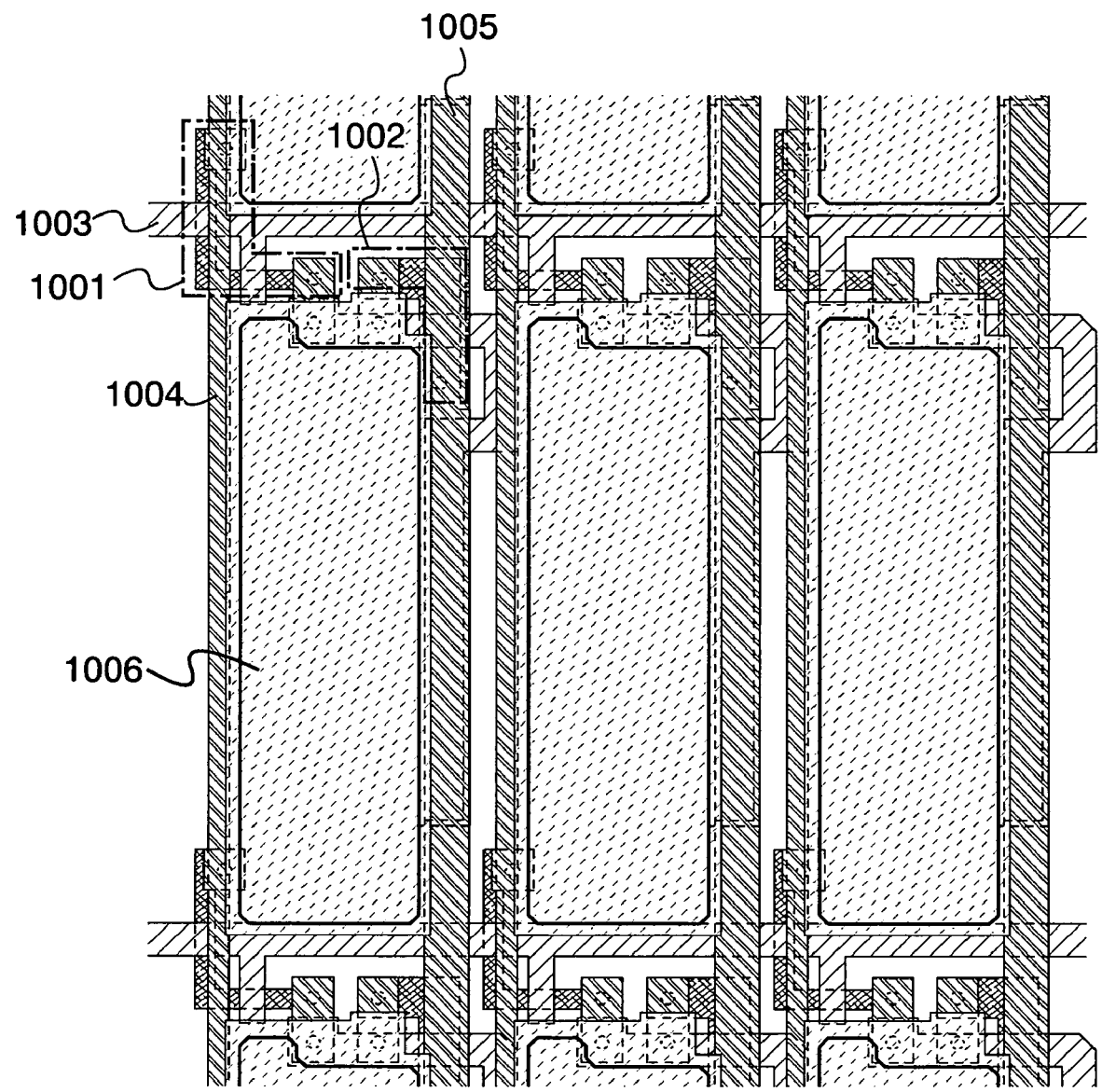
FIG. 5 is a diagram illustrating one embodiment of a pixel portion included in a light-emitting device according to the present invention.

In addition, arrangement of a transistor, a light-emitting element, and the like is not particularly limited. For example, arrangement shown in a top view of FIG. 5 can be employed. In FIG. 5, a first transistor 1001 has a first electrode connected to a source signal line 1004 and a second electrode connected to a gate electrode of a second transistor 1002. Further, the second transistor 1002 has a first electrode connected to a current supply line 1005 and a second electrode connected an electrode 1006 of a light-emitting element. A portion of a gate signal line 1003 serves as a gate electrode of the first transistor 1001.

Figure 6:
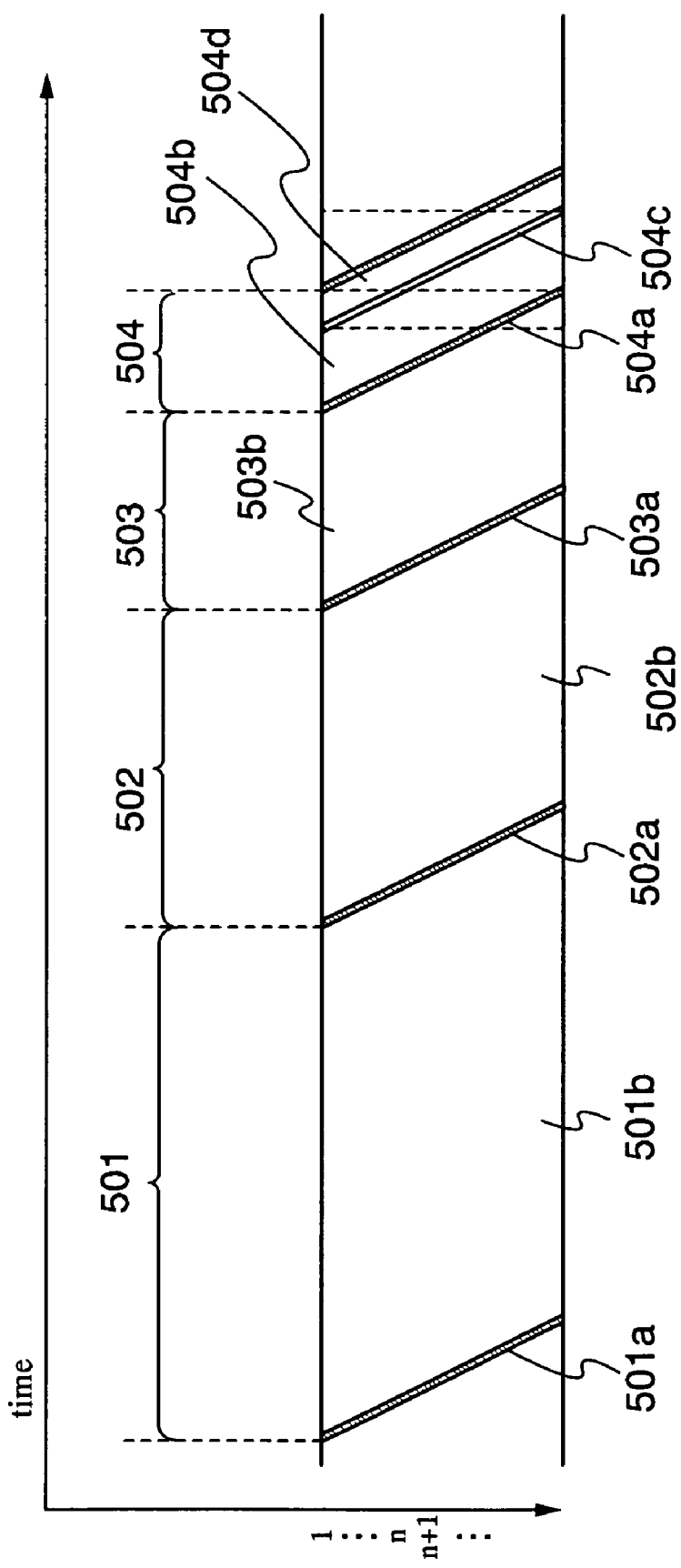
FIG. 6 is a frame diagram illustrating a method for a pixel included in a light-emitting device according to the present invention.

Next, a driving method will be described. FIG. 6 is a diagram illustrating operation per frame with time. In FIG. 6, the lateral direction indicates passage of time, and the vertical direction indicates ordinal numbers of gate signal lines.

When a light-emitting device according to the present invention is used to display images, rewrite operation and image display operation for a screen are repeated in a display period. Although the number of rewrites is not particularly limited, it is preferable that the number of rewrites be about 60 times per second so as not to make an image viewer recognize flickers. Here, a period for which rewrite operation and display operation are performed for a screen (one frame) is referred to as one frame period.

As shown in FIG. 6, one frame is divided (time division) into four sub-frames 501, 502, 503, and 504 respectively including writing periods 501a, 502a, 503a, and 504a and retention periods 501b, 502b, 503b, and 504b. In the retention period, a light-emitting element to which a signal for emitting light is given is made to be in an emitting state. The ratio of the length of the retention period in each sub-frame is first sub-frame 501:second sub-frame 502:third sub-frame 503:fourth sub-frame $504=2^3:2^2:2^1:2^0=8:4:2:1$. This makes 4-bit gradation possible. However, the number of bits or the number of gradations is not limited to that described here. For example, eight sub-frames may be provided so as to perform 8-bit gradation.

Operation in one frame will be described. First, in the sub-frame 501, writing operation is sequentially performed for each of the first row to the last row. Accordingly, the start time of the writing period 501a is different depending on the row. When the writing period 501a is completed, the row is sequentially moved into the retention period 501b. In the retention period 501b, a light-emitting element to which a signal for emitting light is given is made to be in an emitting state. Further, when the retention period 501b is completed, the row is sequentially moved into the next sub-frame 502, and writing operation is sequentially performed for each of the first row to the last row as in the case of the sub-frame 501. The operation described above is repeated to complete the retention period 504b of the sub-frame 504. When the operation in the sub-frame 504 is completed, the row is moved into the next frame. Thus, the total of time for which light is emitted in each sub-frame is emission time for each light-emitting element in one frame. By varying this emission time with respect to each light-emitting element to have various combinations in one pixel, various different display colors in luminosity and chromaticity can be made.

As in the sub-frame 504, when forcible termination of a retention period of a row for which writing is already completed to move into the retention time is required before writing for the last row is completed, it is preferable that an erasing period 504c be provided after the retention period 504b and a row be controlled so as to be in a non-emitting state forcibly. Further, the row made to be in the non-emitting state forcibly is kept the non-emitting state for a certain period (this period is referred to as a non-emission period 504d). Then, immediately after the writing period 504a of the last row is completed, the rows are sequentially moved into the writing period of the next sub-frame (or frame), starting from the first row. This makes it possible to prevent the writing period 504a of the sub-frame 504 from overlapping with the writing period of the next sub-frame.

Although the sub-frames 501 to 504 are arranged in the order of retention period from longest to shortest in the present embodiment, the arrangement as in the present embodiment is not always necessary. For example, the sub-frames 501 to 504 may be arranged in the order of retention period from shortest to longest, or may be arranged in random order. In addition, the sub-frames may be divided further into a plurality of frames, namely, scanning of the gate signal lines may be performed more than once while giving the same image signal.

Now, operation of the circuit shown in FIG. 4 in a writing period and an erasing period will be described.

First, operation in a writing period will be described. In the writing period, the n-th (n is a natural number) gate signal line 911 is electrically connected to the gate signal line driver circuit 913 for writing through the switch 918, and unconnected to the gate signal line driver circuit 914 for erasing. In addition, the source signal line 912 is electrically connected to the source signal line driver circuit 915 through the switch 920. In this case, a signal is input to the gate of the first transistor 901 connected to the n-th (n is a natural number) gate signal line 911 to turn on the first transistor 901. Then, at this moment, image signals are input simultaneously to the first to last source signal lines 912. It is to be noted that the image signals input from the respective source signal lines 912 are independent of each other. The image signal input from each of the source signal lines 912 is input to the gate electrode of the second transistor 902 through the first transistor 901 connected to the source signal line 912. At this moment, the value of current to be supplied from the current supply line 917 to the light-emitting element 903 is determined in accordance with the signal input to the second transistor 902. Then, depending on the value of the current, whether the light-emitting element 903 emits light or not is determined. For example, when the second transistor 902 is a p-channel transistor, the light-emitting element 903 is made to emit light by inputting a Low Level signal to the gate electrode of the second transistor 902. On the other hand, when the second transistor 902 is an n-channel transistor, the light-emitting element 903 is made to emit light by inputting a High Level signal to the gate electrode of the second transistor 902.

Next, operation in an erasing period will be described. In the erasing period, the n-th (n is a natural number) gate signal line 911 is electrically connected to the gate signal line driver circuit 914 for erasing through the switch 919. In addition, the source signal line 912 is electrically connected to the power source 916 through the switch 920. In this case, a signal is input to the gate of the first transistor 901 connected to the n-th (n is a natural number) gate signal line 911 to turn on the first transistor 901. Then, at this moment, erasing signals are input simultaneously to the first to last source signal lines 912. The erasing signal input from each of the source signal lines 912 is input to the gate electrode of the second transistor 902 through the first transistor 901 connected to the source signal line 912. At this moment, current supply from the current supply line 917 to the light-emitting element 903 is blocked in accordance with the signal input to the second transistor 902. Then, the light-emitting element 903 is forcibly made to be in a non-emitting state. For example, when the second transistor 902 is a p-channel transistor, the light-emitting element 903 is made to emit no light by inputting a High Level signal to the gate electrode of the second transistor 902. On the other hand, when the second transistor 902 is an n-channel transistor, the light-emitting element 903 is made to emit no light by inputting a Low Level signal to the gate electrode of the second transistor 902.

It is to be noted that, as for the n-th row (n is a natural number), signals for erasing are input by the operation as described above in an erasing period. However, as described above, the other row (referred to as the m-th row (m is a natural number)) may be in a writing period while the n-th row is in an erasing period. In such a case, it is necessary to input a signal for erasing to the n-th row and input a signal for writing to the m-th row by using the same source signal line. Therefore, operation described below is preferable.

Immediately after the n-th light-emitting element 903 is made to emit no light by the operation in the erasing period described above, the gate signal line 911 and the gate signal line driver circuit 914 for erasing are made to be unconnected to each other, and the switch 920 is switched to connect the source signal line 912 and the source signal line driver circuit 915. Then, in addition to connecting the source signal line 912 to the source signal line driver circuit 915, the gate signal line 911 is connected to the gate signal line driver circuit 913 for writing. Then, a signal is input selectively to the m-th gate signal line 911 from the gate signal line driver circuit 913 for writing to turn on the first transistor 901, and signals for writing are input to the first to last source signal lines 912 from the source signal line driver circuit 915. This signal makes the m-th light-emitting element 903 is made to be in an emitting or non-emitting state.

Immediately after the writing period for the m-th row is completed as described above, an erasing period for the (n+1)-th row is started. For that purpose, the gate signal line 911 and the gate signal line driver circuit 913 for writing are made to be unconnected to each other, and the switch 920 is switched to connect the source signal line 912 and the power source 916. Further, the gate signal line 911, which is unconnected to the gate signal line driver circuit 913 for writing, is made to be connected to the gate signal line driver circuit 914 for erasing. Then, a signal is input selectively to the (n+1)-th gate signal line 911 from the gate signal line driver circuit 914 for erasing to turn on the first transistor 901, and an erasing signal is input from the power source 906. Immediately after the erasing period for the (n+1)-th row is completed, a writing period for the (m+1)-th row is started. Then, an erasing period and a writing period may be repeated in the same way until an erasing period for the last row is completed.

Although the example in which the writing period for the m-th row is provided between the erasing period for the n-th row and the erasing period for the (n+1)-th row is described in the present embodiment, the present invention is not limited to this. The writing period for the m-th row may be provided between an erasing period for (n−1)-th row and an erasing period for n-th row.

In addition, in the present embodiment, the operation in which the gate signal line driver circuit 914 for erasing and one gate signal line 911 are made to be unconnected to each other and the gate signal line driver circuit 913 for writing the other gate signal line 911 are made to be connected to each other is repeated as the non-emission period 504d is provided in the sub-frame 504. This type of operation may be performed in a frame in which a non-emission period is not provided.

Embodiment 3

One embodiment of a light-emitting device including a light-emitting element according to the present invention will be described with reference to FIGS. 7A to 7C.

Figure 7A:
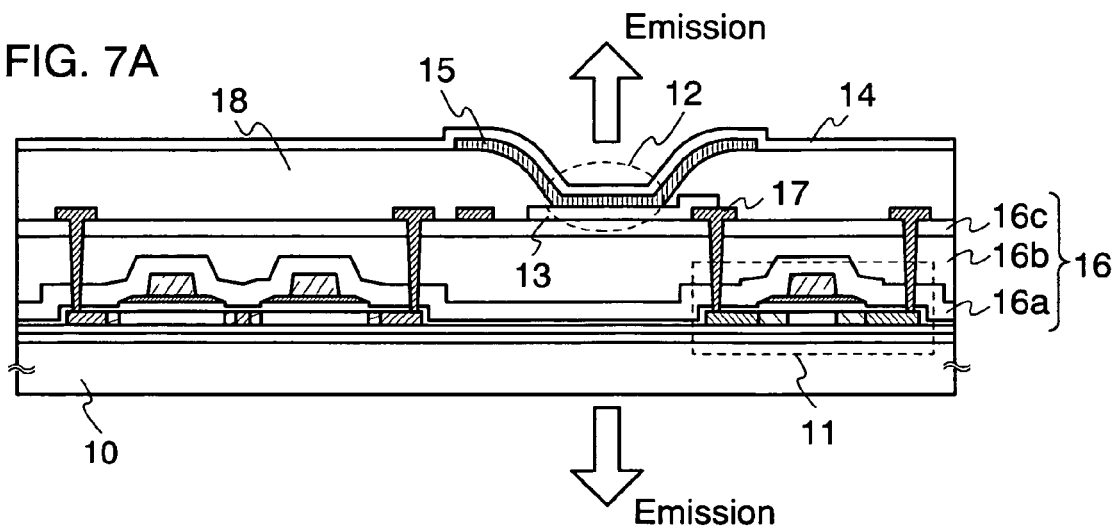
FIGS. 7A to 7C are diagrams illustrating one embodiment of cross sections of light-emitting devices according to the present invention.
Figure 7B:
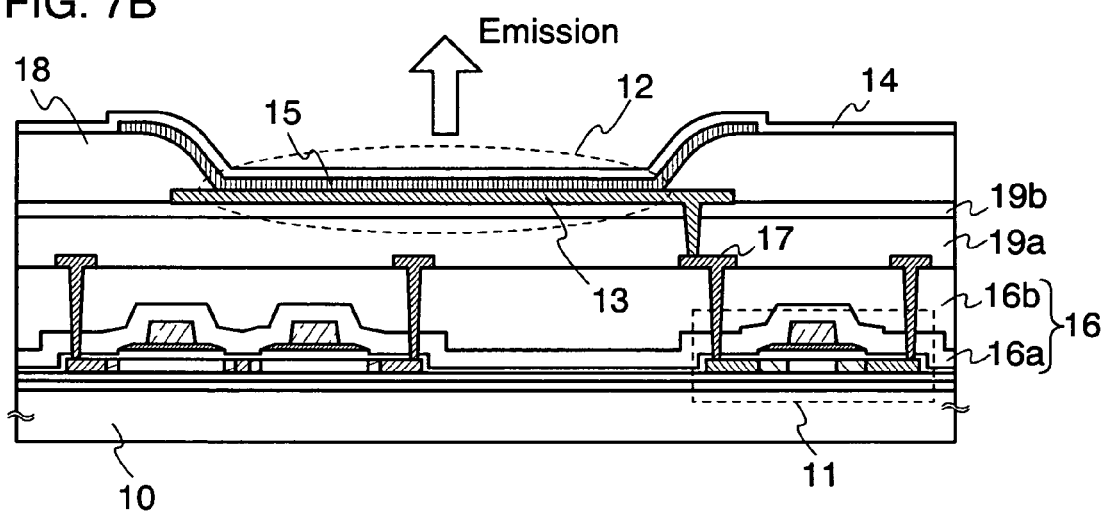
Figure 7C:
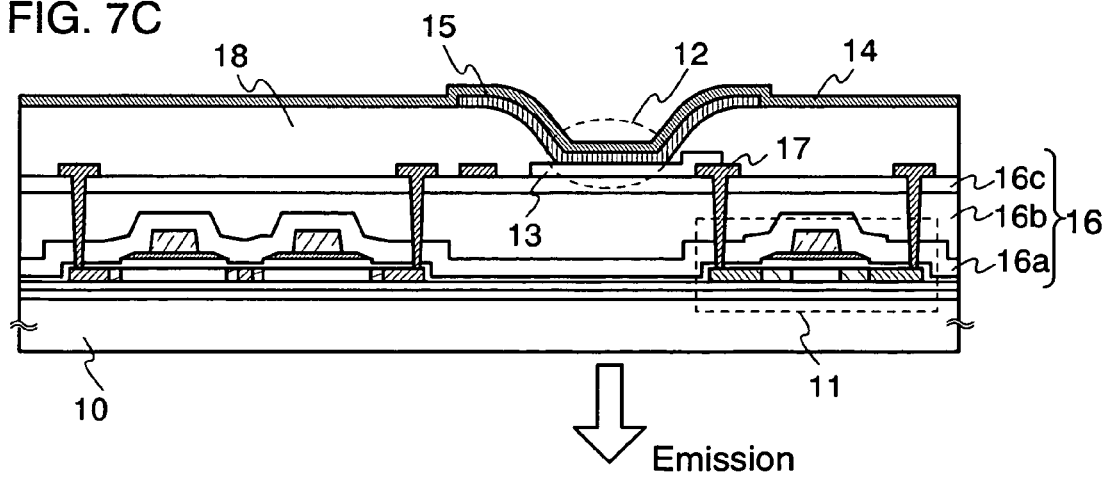

In each of FIGS. 7A to 7C, a portion surrounded by a dotted line is a transistor 11 provided for driving a light-emitting element 12 according to the present invention. The light-emitting element 12 is a light-emitting element according to the present invention, which has a layer 15 in which a hole generating layer, an electron generating layer, and a layer including a luminescent material are stacked between a first electrode 13 and a second electrode 14. The first electrode 13 and a drain of the transistor 11 are electrically connected to each other by a wiring 17 running through a first interlayer insulating film 16 (16a to 16c). In addition, the light-emitting element 12 is separated by a partition layer 18 from another light-emitting element provided adjacently. A light-emitting device that has this structure according to the present invention is provided over substrate 10.

The transistor 11 shown in each of FIGS. 7A to 7C is a top-gate TFT in which a gate electrode is provided on the opposite side of a semiconductor layer as a center from a substrate. However, the structure of the transistor 11 is not particularly limited. For example, a bottom-gate TFT may be used. In the case of a bottom-gate TFT, a TFT where a protective film is formed on a semiconductor layer that forms a channel (a channel-protected TFT) may be used, or a TFT where a portion of a semiconductor layer that forms a channel is concave (a channel-etched TFT) may be used.

In addition, a semiconductor layer forming the transistor 11 may be either crystalline or amorphous, or alternatively, may be semi-amorphous.

The following will describe a semi-amorphous semiconductor. The semi-amorphous semiconductor is a semiconductor that has an intermediate structure between amorphous and crystalline (such as single-crystal or polycrystalline) structures and has a third state that is stable in terms of free energy, which includes a crystalline region that has short range order and lattice distortion. Further, a crystal grain from 0.5 to 20 nm is included in at least a region in a film of the semi-amorphous semiconductor. A raman spectrum of the semi-amorphous semiconductor shifts to a lower wavenumber side than 520 cm$^{-1}$. In X-ray diffraction, diffraction peaks of (111) and (220) due to a Si crystal lattice are observed. Hydrogen or halogen is included at 1 atomic % or more in the semi-amorphous semiconductor to terminate a dangling bond. Therefore, the semi-amorphous semiconductor is also referred to as a micro-crystalline semiconductor. $SiH_4$, $Si_2H_6$, $SiH_2Cl_2$, $SiHCl_3$, $SiCl_4$, $SiF_4$, or the same is decomposed by glow discharge (plasma CVD) to form the semi-amorphous semiconductor. These gases may be diluted with $H_2$ or with $H_2$ and one kind or plural kinds of rare gas elements selected from He, Ar, Kr, and Ne, where the dilution ratio is in the range of 2:1 to 1000:1. The pressure during glow discharge is approximately in the range of 0.1 Pa to 133 Pa, and the power supply frequency is in the range of 1 MHz to 120 MHz, preferably 13 MHz to 60 MHz. The substrate heating temperature may be 300° C. or less, preferably 100 to 250° C. It is desirable to control an impurity of an atmospheric constituent such as oxygen, nitrogen, or carbon to have a concentration of $1 \times 10^{20}/cm^3$ or less as an impurity element in the film, in particular, the oxygen concentration is controlled to be $5 \times 10^{19}/cm^3$ or less, preferably $1 \times 10^{19}/cm^3$ or less. Further, the mobility a TFT (thin film transistor) using the semi-amorphous semiconductor is approximately 1 to 10 m$^2$/Vsec.

In addition, specific examples of crystalline semiconductors for the semiconductor layer include single-crystal or polycrystalline silicon and silicon-germanium, which may be formed by laser crystallization or may be formed by crystallization with solid-phase growth using an element such as nickel.

In the case of using an amorphous material, for example, amorphous silicon to form the semiconductor layer, it is preferable that the light-emitting device have a circuit in which the transistor 11 and the other transistor (a transistor forming the circuit for driving the light-emitting element) are all n-channel transistors. Other than that case, the light-emitting device may have a circuit including one of an n-channel transistor and a p-channel transistor or may have a circuit including both an n-channel transistor and a p-channel transistor.

Further, the first interlayer insulating film 16 (16a to 16c) may be a multilayer as shown in FIGS. 7A and 7C, or may be a single layer. The first interlayer insulating film 16a includes an inorganic material such as silicon oxide or silicon nitride, and the first interlayer insulating film 16b includes a material with self-flatness such as acrylic, siloxane (a compound that has a framework structure formed by a bond between silicon (Si) and oxygen (O) and includes hydrogen or an organic group such as an alkyl group as a substituent), or silicon oxide that can be used in coating deposition. In addition, the first interlayer insulating film 16c has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the first interlayer insulating film 16.

As for the partition layer 18, it is preferable that an edge portion have a shape varying continuously in curvature radius. In addition, a material such as acrylic, siloxane, resist, or silicon oxide is used to form the partition layer 18. One or both of an inorganic material and an organic material may be used to form the partition layer 18.

In each of FIGS. 7A and 7C, only the first interlayer insulating film 16 is provided between the transistor 11 and the light-emitting element 12. However, as shown in FIG. 7B, a second interlayer insulating film 19 (19a and 19b) may be provided in addition to the first interlayer insulating film 16 (16a and 16b). In the light-emitting device shown in FIG. 7B, the first electrode 13 is connected to the wiring 17 through the second interlayer insulating film 19.

The second interlayer insulating film 19 may be a multi-layer or a single layer in the same way as the first interlayer insulating film 16. The second interlayer insulating film 19a includes a material with self-flatness such as acrylic, siloxane, or silicon oxide that can be used in coating deposition. In addition, the second interlayer insulating film 19b has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the second interlayer insulating film 19.

In the light-emitting element 12, in the case where both of the first electrode 13 and the second electrode 14 are formed by using a light-transmitting material, emitted light can be extracted from both the first electrode 13 side and the second electrode 14 side as indicated by outline arrows of FIG. 7A. In the case where only the second electrode 14 is formed by using a light-transmitting material, emitted light can be extracted from only the second electrode 14 side as indicated by an outline arrow of FIG. 7B. In this case, it is preferable that the first electrode 13 include a highly reflective material or that a film composed of a highly reflective material (a reflective film) be provided below the first electrode 13. In the case where only the first electrode 13 is formed by using a light-transmitting material, emitted light can be extracted from only the first electrode 13 side as indicated by an outline arrow of FIG. 7C. In this case, it is preferable that the second electrode 14 include a highly reflective material or that a reflective film is provided above the second electrode 14.

In addition, as for the light-emitting element 12, the layer 15 may be stacked so that the light-emitting element 12 operates when a voltage is applied so that the potential of the second electrode 14 is higher than the potential of the first electrode 13, or may be stacked so that the light-emitting element 12 operates when a voltage is applied so that the potential of the second electrode 14 is lower than the potential of the first electrode 13. The transistor 11 is a p-channel transistor in the former case, and the transistor 11 is an n-channel transistor in the latter case.

Figure 8:
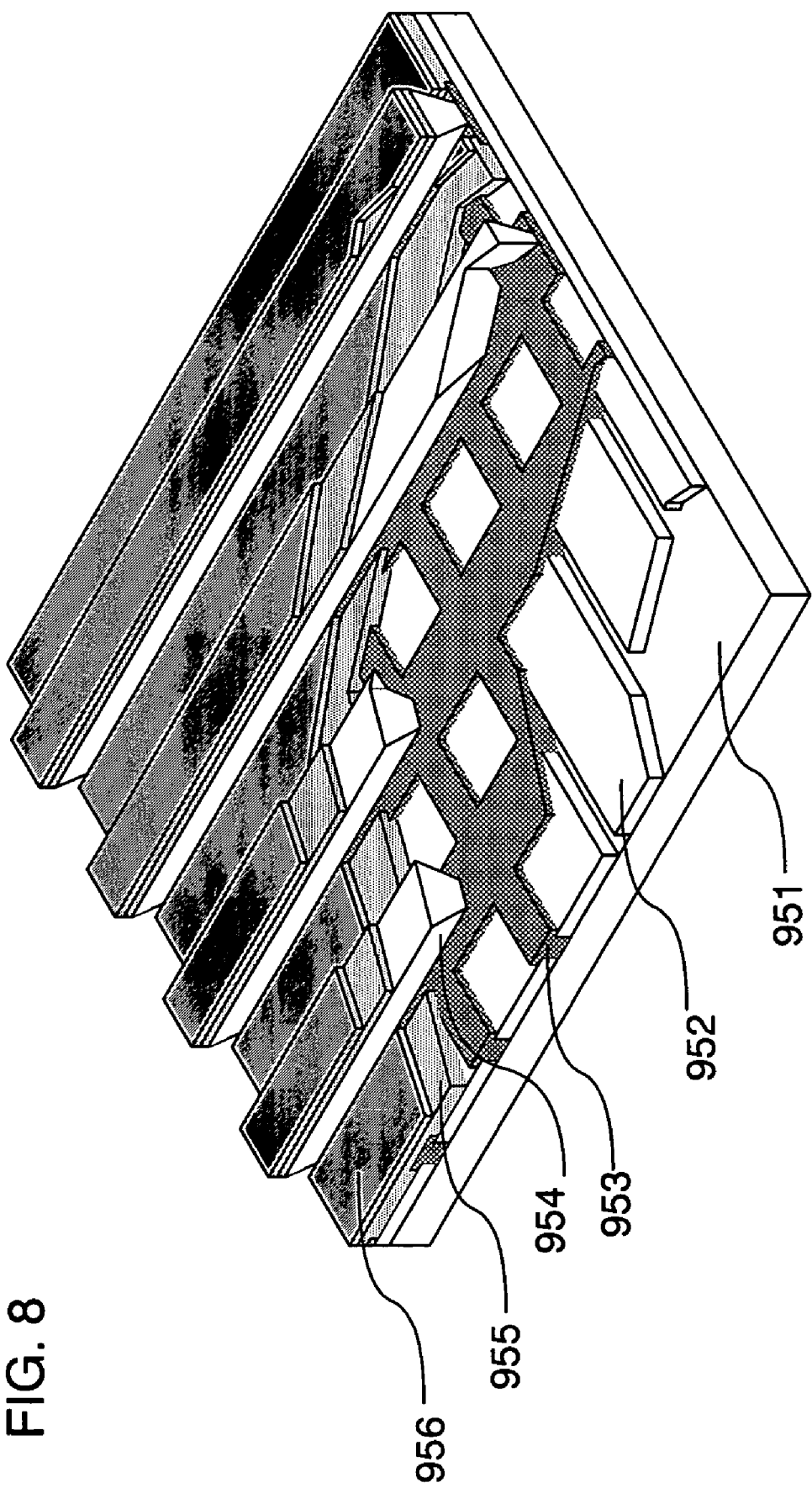
FIG. 8 is a perspective view illustrating one embodiment of a light-emitting device according to the present invention.

As described above, an active light-emitting device is described in the present embodiment. However, in addition to this, a passive light-emitting device in which a light-emitting element is driven without especially providing a driving element such as a TFT may be employed. FIG. 8 shows a perspective view of a passive light-emitting device manufactured according to the present invention. In FIG. 8, a layer 955 in which a layer including a luminescent material, an electron generating layer, and a hole generating layer are stacked in order is provided between electrodes 952 and 956 over a substrate 951. The electrode 952 has an edge portion covered with an insulating layer 953. Further, a partition layer 954 is provided on the insulating layer 953. The partition layer 954 has sloping side walls so that the distance between one side wall and the other is narrower toward the surface of the substrate, namely, the cross section of the partition layer 954 is trapezoidal in the direction of a narrow side, where the lower base (the side facing in the same direction as the plane direction of the insulating layer 953 and being in contact with the insulating layer 953) is shorter than the upper base (the side facing in the same direction as the plane direction of the insulating layer 953 and being not in contact with the insulating layer). By providing the partition layer 954 in this way, defects of a light-emitting element due to static electricity or the like can be prevented. Further, the passive light-emitting element can be driven also with lower power consumption by including a light-emitting element according to the present invention, which operates at a lower driving voltage.

Embodiment 4

A light-emitting device using a light-emitting element according to the present invention for a pixel has fewer defects in display due to defects in operation of the light-emitting element and operates well for display. Therefore, an electronic device that has fewer display image recognition errors due to defects of images can be obtained by applying this light-emitting device to a display portion thereof. Further, a light-emitting device using a light-emitting element according to the present invention for a light source has less trouble due to defects in operation of the light-emitting element and is capable of emitting light well. Therefore, by using this light-emitting device as a lighting portion such as a backlight and thus mounting the light-emitting device according to the present invention, defects in operation, such as a dark portion formed locally due to trouble of the light-emitting element, are reduced, and images can be thus displayed well.

Figure 9A:
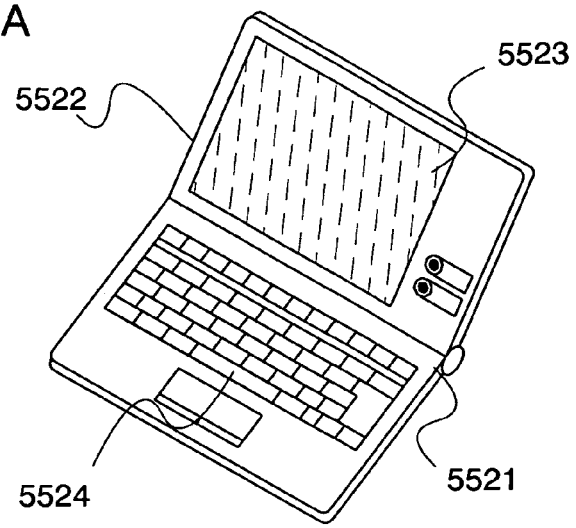
FIGS. 9A to 9C are diagrams illustrating one embodiment of electronic devices to which the present invention is applied.
Figure 9B:
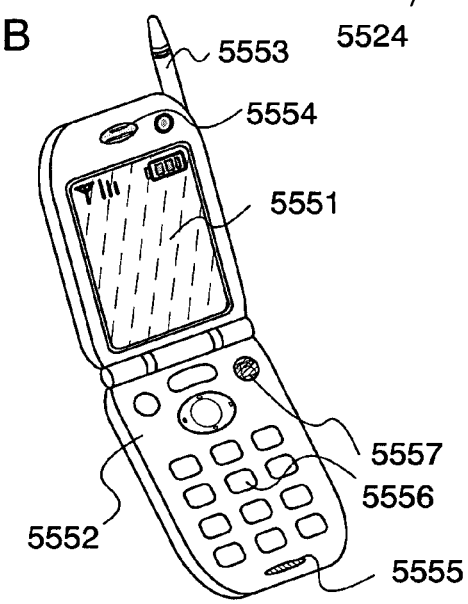
Figure 9C:
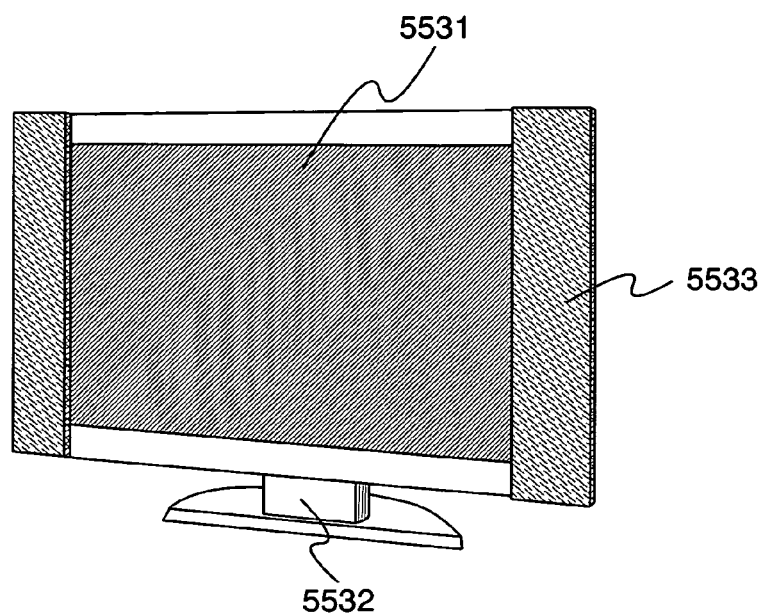

FIGS. 9A to 9C show examples of electronic devices mounted with a light-emitting device to which the present invention is applied.

Figure 10:
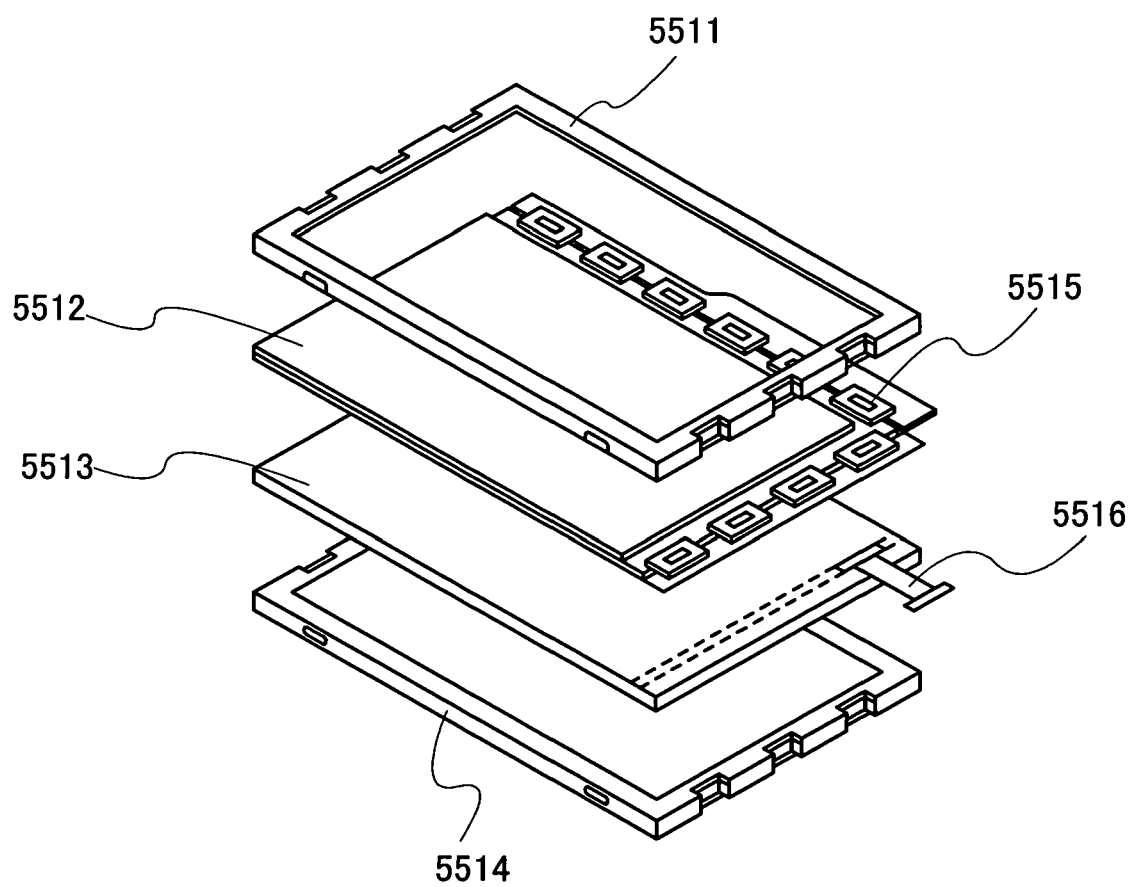
FIG. 10 is a diagram illustrating a lighting device to which the present invention is applied.

FIG. 9A shows a personal computer manufactured according to the present invention, which includes a main body 5521, a frame body 5522, a display portion 5523, and a keyboard 5524. The personal computer can be completed by incorporating a light-emitting device using a light-emitting element according to the present invention for a pixel into the display portion 5523. Further, also when a light-emitting device using a light-emitting element according to the present invention as a light source is incorporated as a backlight, a personal computer can be completed. Specifically, a personal computer using a light-emitting element according to the present invention as a light source can be completed by mounting a liquid crystal device 5512 and a light-emitting device 5513 provided with at least a light-emitting element according to the present invention in frame bodies 5511 and 5514 as shown in FIG. 10 for a display portion of the personal computer. An external input terminal 5515 and an external input terminal 5516 attached to the liquid crystal device 5512 and the light-emitting device 5513, respectively. In addition, in the light-emitting device 5513, a plurality of light-emitting elements according to the present invention may be arranged, or one light-emitting element may be provided to cover a large portion of the substrate. The luminescent color from the light-emitting element is not particularly limited in the light-emitting device 5513, and may be white, red, blue, green, or the like.

FIG. 9B shows a phone manufactured according to the present invention, which includes a main body 5552, a display portion 5551, a voice output portion 5554, a voice input portion 5555, operation keys 5556 and 5557, and an antenna 5553. The phone can be completed by incorporating a light-emitting device that has a light-emitting element according to the present invention into the display portion 5551.

FIG. 9C shows a television manufactured according to the present invention, which includes a display portion 5531, a frame body 5532, and a speaker 5533. The television can be completed by incorporating a light-emitting device that has a light-emitting element according to the present invention into the display portion 5531.

As described above, a light-emitting device according to the present invention is quite suitable for use as display portions of various electronic devices. It is to be noted that the electronic devices are not to be considered limited to those described in the present embodiment, and include other electronic devices such as a navigation system.

Example 1

The result of observing a layer that is used for practicing the present invention with transmission electron microscope will be described.

Figure 11:
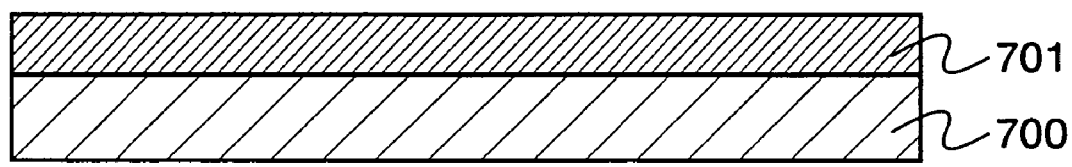
FIG. 11 is a diagram illustrating a manufacturing method in Example 1.

For preparing a sample to be used for observation, a first layer 701 was formed on a silicon wafer 700 by co-evaporation with the use of molybdenum trioxide, DNTPD, and rubrene as materials (FIG. 11). The thickness of the first layer 701 was made to be 200 nm. The co-evaporation here indicates an evaporation method in which respective raw materials are evaporated from a plurality of evaporation sources provided in one process chamber to deposit the materials on an object to be processed. It is to be noted that the pressure in the process chamber was adjusted to be $1 \times 10^{-4}$ Pa, and each raw material was heated and evaporated by resistance heating.

Further, the deposition rates of molybdenum oxide, DNTPD, and rubrene were adjusted so that the molar ratio of molybdenum atoms to DNTPD (=molybdenum atom/DNTPD) and the molar ratio of rubrene to DNTPD (=rubrene/DNTPD) are respectively 3 and 0.01 in the first layer 701 formed as described above.

Figure 12:
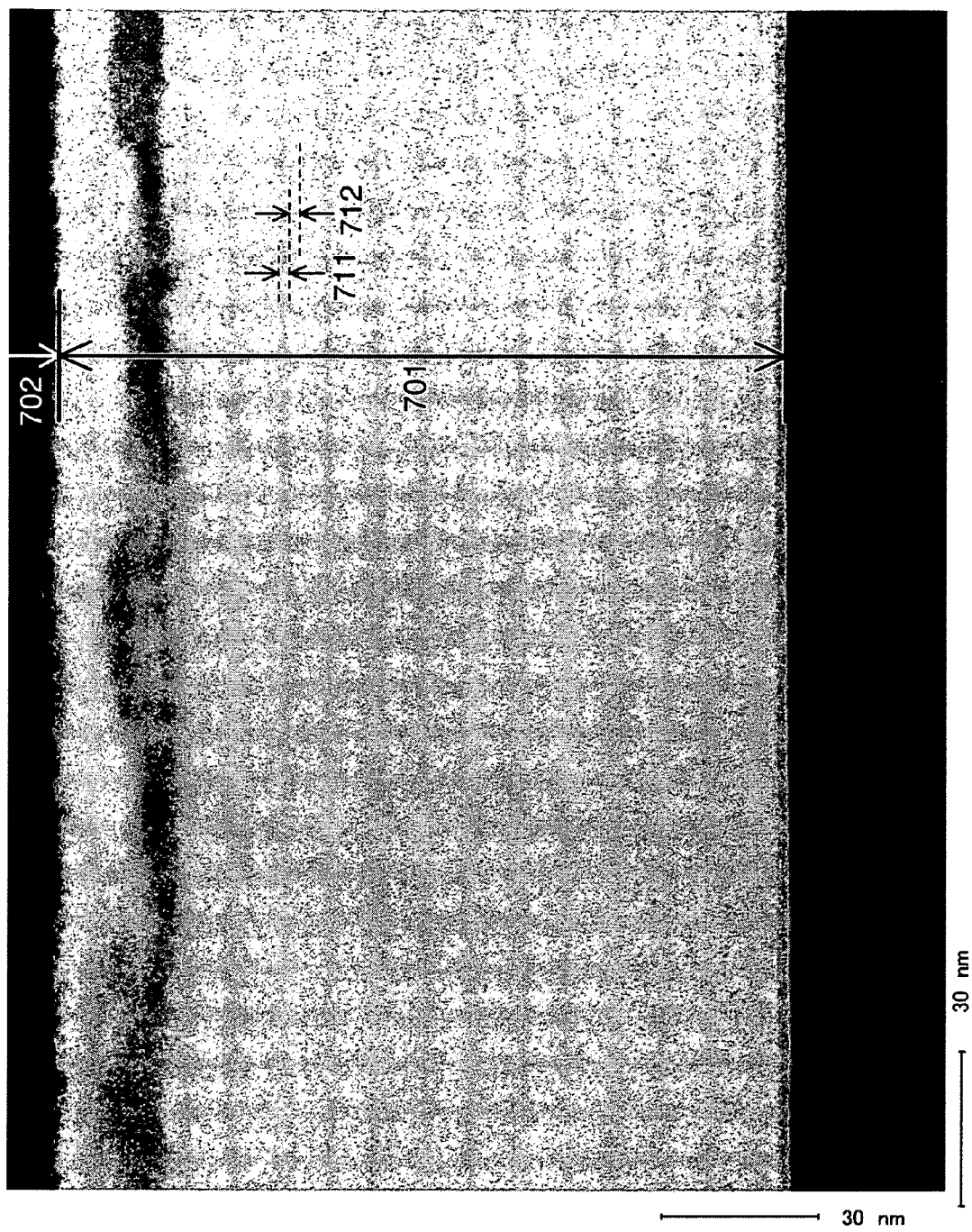
FIG. 12 is an image obtained by observation with a transmission electron microscope.

A cross section of the thus prepared sample was observed with a transmission electron microscope (TEM). It is to be noted that, for the observation, the first layer 701 was covered with a second layer 702 composed of platinum. FIG. 12 shows an image (magnification: 1,000,000) obtained by the observation. It is determined from FIG. 12 a first region 711 that is deep in color and a second region 712 that is pare in color are present alternately in the first layer 701, namely, it is determined that a region in which the concentration of molybdenum is higher and a region in which the concentration of molybdenum is lower are present alternately. Further, it is determined from FIG. 12 that each of the first region 711 that has a higher concentration of molybdenum and the second region 712 that has a lower concentration of molybdenum has a distance of approximately 30 nm in the thickness direction of the layer.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

What is claimed is:

1. A light-emitting device comprising:
a mixed layer formed between a pair of electrodes and in contact with one of the pair of electrodes,
wherein the mixed layer comprises plural first regions and plural second regions,
wherein each of the first regions and each of the second regions include a metal oxide and a compound that exhibits an electron donating property to the metal oxide,
wherein the first regions and the second regions are provided alternately in a thickness direction of the mixed layer, and
wherein a concentration of the metal oxide in the first regions is higher than a concentration of the metal oxide in the second regions.

2. The light-emitting device according to claim 1,
wherein the compound is an aromatic amine compound.

3. The light-emitting device according to claim 1,
wherein the metal oxide includes a metal atom belonging to any one of Groups 4 to 8 of the periodic table of the elements.

4. The light-emitting device according to claim 3,
wherein the metal atom is selected from a group consisting of vanadium, molybdenum, rhenium, and ruthenium.

5. The light-emitting device according to claim 1,
wherein the light-emitting device is incorporated into an electronic device selected from the group consisting of a personal computer, a phone, and a television.

6. The light-emitting device according to claim 1,
wherein at least one of the first regions is sandwiched between two of the second regions and is in contact with the two of the second regions.

7. The light-emitting device according to claim 1,
wherein each of the first regions and each of the second regions have a thickness equal to or larger than 0.1 nm and equal to or smaller than 10 nm.

8. A light-emitting device comprising:
a mixed layer formed between a pair of electrodes and in contact with one of the pair of electrodes,
wherein the mixed layer comprises plural first regions and plural second regions,
wherein each of the first regions and each of the second regions include a metal oxide and a compound that exhibits an electron donating property to the metal oxide,
wherein the first regions and the second regions are provided alternately in a thickness direction of the mixed layer,
wherein a concentration of the metal oxide in the first regions is higher than a concentration of the metal oxide in the second regions,
wherein a molar ratio of the metal oxide to the compound is equal to or larger than 0.1 and equal to or smaller than 10 in the first regions and the second regions.

9. The light-emitting device according to claim 8,
wherein the compound is an aromatic amine compound.

10. The light-emitting device according to claim 8,
wherein the metal oxide includes a metal atom belonging to any one of Groups 4 to 8 of the periodic table of the elements.

11. The light-emitting device according to claim 10,
wherein the metal atom is selected from a group consisting of vanadium, molybdenum, rhenium, and ruthenium.

12. The light-emitting device according to claim 8,
wherein the light-emitting device is incorporated into an electronic device selected from the group consisting of a personal computer, a phone, and a television.

13. The light-emitting device according to claim 8,
wherein at least one of the first regions is sandwiched between two of the second regions and is in contact with the two of the second regions.

14. The light-emitting device according to claim 8,
wherein each of the first regions and each of the second regions have a thickness equal to or larger than 0.1 nm and equal to or smaller than 10 nm.

15. A light-emitting device comprising:
a mixed layer formed between a pair of electrodes and in contact with one of the pair of electrodes,
wherein the mixed layer comprises plural first regions and plural second regions,
wherein each of the first regions and each of the second regions include a metal oxide, a first compound that exhibits an electron donating property to the metal oxide, and a second compound that has a lower LUMO level and a higher HOMO level than the first compound,
wherein the first regions and the second regions are provided alternately in a thickness direction of the mixed layer, and
wherein a concentration of the metal oxide in the first regions is higher a concentration of than the metal oxide in the second regions.

16. The light-emitting device according to claim 15, wherein the compound is an aromatic amine compound.

17. The light-emitting device according to claim 15, wherein the metal oxide includes a metal atom belonging to any one of Groups 4 to 8 of the periodic table of the elements.

18. The light-emitting device according to claim 17, wherein the metal atom is selected from a group consisting of vanadium, molybdenum, rhenium, and ruthenium.

19. The light-emitting device according to claim 15, wherein the light-emitting device is incorporated into an electronic device selected from the group consisting of a personal computer, a phone, and a television.

20. The light-emitting device according to claim 15, wherein at least one of the first regions is sandwiched between two of the second regions and is in contact with the two of the second regions.

21. The light-emitting device according to claim 15, wherein each of the first regions and each of the second regions have a thickness equal to or larger than 0.1 nm and equal to or smaller than 10 nm.

22. A light-emitting device comprising:
a mixed layer formed between a pair of electrodes and in contact with one of the pair of electrodes,
wherein the mixed layer comprises plural first regions and plural second regions,
wherein each of the first regions and each of the second regions include a metal oxide, a first compound that exhibits an electron donating property to the metal oxide, and a second compound that has a lower LUMO level and a higher HOMO level than the first compound,
wherein the first regions and the second regions are provided alternately in a thickness direction of the mixed layer,
wherein a concentration of the metal oxide in the first regions is higher than a concentration of the metal oxide in the second regions, and
wherein a molar ratio of the metal oxide to the first compound is equal to or larger than 0.1 and equal to or smaller than 10 in the first regions and the second regions.

23. The light-emitting device according to claim 22, wherein the compound is an aromatic amine compound.

24. The light-emitting device according to claim 22, wherein the metal oxide includes a metal atom belonging to any one of Groups 4 to 8 of the periodic table of the elements.

25. The light-emitting device according to claim 24, wherein the metal atom is selected from a group consisting of vanadium, molybdenum, rhenium, and ruthenium.

26. The light-emitting device according to claim 22, wherein the light-emitting device is incorporated into an electronic device selected from the group consisting of a personal computer, a phone, and a television.

27. The light-emitting device according to claim 22, wherein at least one of the first regions is sandwiched between two of the second regions and is in contact with the two of the second regions.

28. The light-emitting device according to claim 22, wherein each of the first regions and each of the second regions have a thickness equal to or larger than 0.1 nm and equal to or smaller than 10 nm.

* * * * *

UNITED STATES PATENT AND TRADEMARK OFFICE
CERTIFICATE OF CORRECTION

PATENT NO. : 7,667,389 B2 Page 1 of 1
APPLICATION NO. : 11/294590
DATED : February 23, 2010
INVENTOR(S) : Ikeda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1046 days.

Signed and Sealed this

Twenty-eighth Day of December, 2010

David J. Kappos
*Director of the United States Patent and Trademark Office*